United States Patent
Sjöland et al.

(10) Patent No.: US 10,771,066 B2
(45) Date of Patent: Sep. 8, 2020

(54) PHASE LOCKED LOOP, PHASE LOCKED LOOP ARRANGEMENT, TRANSMITTER AND RECEIVER AND METHOD FOR PROVIDING AN OSCILLATOR SIGNAL

(71) Applicant: Telefonaktiebolaget LM Ericsson (publ), Stockholm (SE)

(72) Inventors: Henrik Sjöland, Lund (SE); Tony Påhlsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/310,568

(22) PCT Filed: Jul. 1, 2016

(86) PCT No.: PCT/EP2016/065589
§ 371 (c)(1),
(2) Date: Dec. 17, 2018

(87) PCT Pub. No.: WO2018/001526
PCT Pub. Date: Jan. 4, 2018

(65) Prior Publication Data
US 2019/0341921 A1 Nov. 7, 2019

(51) Int. Cl.
*H03L 7/08* (2006.01)
*H03L 7/081* (2006.01)
(Continued)

(52) U.S. Cl.
CPC ............... *H03L 7/081* (2013.01); *H03L 7/07* (2013.01); *H03L 7/0891* (2013.01); *H03L 7/099* (2013.01); *H03L 7/18* (2013.01); *H04L 7/0331* (2013.01)

(58) Field of Classification Search
CPC ......... H03L 7/081; H03L 7/0891; H03L 7/07; H03L 7/099; H03L 7/18; H04L 7/0331
See application file for complete search history.

(56) References Cited

U.S. PATENT DOCUMENTS 6,147,561 A 11/2000 Rhee et al.
7,492,850 B2 2/2009 Menolfi et al.
(Continued)

FOREIGN PATENT DOCUMENTS

EP 1184988 A2 3/2002
EP 2843839 A1 3/2015
(Continued)

OTHER PUBLICATIONS

Buchanan, N.B., "Triple Mode PLL Antenna Array", 2004 IEEE MTT-S International Microwave Symposium Digest, Jun. 6, 2004, pp. 1691-1694, IEEE.
(Continued)

*Primary Examiner* — Kabir A Timory
(74) *Attorney, Agent, or Firm* — Coats + Bennett, PLLC (57) ABSTRACT

A phase locked loop, for a particularly in a beamforming system comprises a loop filter (1) to provide a control signal (FC) to a controllable oscillator (2); a frequency divider (3) configured to provide a first feedback signal (FB) and a second feedback signal (FBD) in response to an oscillator signal (FO), wherein the second feedback signal (FBD) is delayed with respect to the first feedback signal (FB). An interpolator is configured to receive the first and the second feedback signal (FB) and to provide an interpolated signal thereof between the first and second feedback signal and in response to a phase control word. A comparator path is configured to receive the interpolated signal and to provide a respective signal to the loop filter (1) in response to a phase deviation between a common reference signal (FR) and the interpolated signal.

11 Claims, 5 Drawing Sheets

(51) Int. Cl.
*H03L 7/07* (2006.01)
*H03L 7/089* (2006.01)
*H03L 7/099* (2006.01)
*H03L 7/18* (2006.01)
*H04L 7/033* (2006.01)

(56) References Cited

U.S. PATENT DOCUMENTS

| | | | |
|---|---|---|---|
| 9,048,843 | B1 | 6/2015 | Nordyke |
| 10,003,346 | B2 | 6/2018 | Sjoland et al. |
| 2003/0112079 | A1* | 6/2003 | Saeki ............... H03L 7/081 331/1 A |
| 2007/0071156 | A1 | 3/2007 | Gregorius et al. |
| 2008/0265999 | A1 | 10/2008 | Wan et al. |
| 2011/0032040 | A1 | 2/2011 | Beghini |
| 2015/0061781 | A1* | 3/2015 | Shimura ............. H03L 7/07 331/25 |
| 2015/0295583 | A1 | 10/2015 | Tang et al. |
| 2018/0138917 | A1 | 5/2018 | Pahlsson et al. |

FOREIGN PATENT DOCUMENTS

| | | |
|---|---|---|
| WO | 2015172372 A1 | 11/2015 |
| WO | 2017108100 A1 | 6/2017 |

OTHER PUBLICATIONS

Shi, B. et al, "Electronic Beam Streering Using PLL Array for Radar Applications in W-band", 2015 IEEE 5th Asia-Pacific Conference on Synthetic Aperture Radar (APSAR), Sep. 1, 2015, pp. 274-276, IEEE.

Axholt, A. et al., "A 60 GHz Receiver Front-End with PLL based Phase Controlled LO Generation for Phased-Arrays", Paper V, Submitted to IEEE Proc. Asia Pacific Microwave Conference, APMC 2011, Dec. 5, 2011, pp. 1-5, IEEE.

Axholt, A. et al., "A PLL based 12GHz LO Generator with Digital Phase Control in 90nm CMOS A", Analog Integrated Circuits and Signal Processing, vol. 67, issue 3, Jan. 1, 2011, pp. 309-318, Springer Reprinted.

Miyashita, D. et al., "A-104dBc/Hz In-Band Phase Noise 3GHz All Digital PPL with a Phase Interpolation Based Hierarchical Time to Digital Convertor", 2011 Symposium on VLSI Circuits Digest of Technical Papers, Jun. 15, 2011, pp. 112-113, IEEE.

* cited by examiner

PHASE LOCKED LOOP, PHASE LOCKED LOOP ARRANGEMENT, TRANSMITTER AND RECEIVER AND METHOD FOR PROVIDING AN OSCILLATOR SIGNAL

TECHNICAL FIELD

The present disclosure relates to a phase locked loop, particularly for a beamforming system, a phase locked loop arrangement, a transmitter and receiver arrangement and a method for providing an oscillator signal in a phase locked loop

BACKGROUND

Wireless systems typically up-convert a baseband signal to a Radio Frequency (RF) for transmission, and down-convert received RF signals to baseband for processing. Such frequency conversion requires producing a reliable mixing frequency signal, typically referred to as a local oscillator (LO) signal, for use in the RF front-end of a wireless device. Phase-Locked Loops (PLLs) are often used to provide such mixing frequency signals. In some cases, stringent requirements are placed on the mixing frequency signal, such as produced by a PLL.

It is foreseeable that 5G cellular systems will use millimetre waves, where the frequencies currently in discussion range between 15 GHz and 60 GHz. In order to use such 5G system outdoors, a longer cyclic prefix has to be used compared to newly released 60 GHz indoor systems. Such longer cyclic prefixes necessitate a closer sub-carrier spacing in the OFDM modulation. This closer sub-carrier spacing poses stringent phase noise requirements on the output of the PLLs. At the same time, beamforming should be supported to increase the range and capacity of the system, which results in a large number of antenna elements. The signal at each antenna element of a beamforming system will have an individual phase shift that controls the beam and in particular the beam direction. In some implementations, the beam controlling phase shifts are imposed on the oscillator signal generated by the PLL. In any event, accurate phase shifts are required to provide accurate beamforming. It is also desirable to be able to program the frequency of the oscillator signal to enable the wireless device to operate on different frequency channels and in different bands.

Besides the ability to introduce a programmable phase shift and programmable frequency, the local oscillator generation circuitry shall also achieve a low phase noise and other aspects without consuming excessive power.

SUMMARY

As a result of all of these considerations, the inventors have realized that it would be beneficial to improve the generation of the oscillator signals so as to provide the desired phase shift programmability.

The solution presented herein proposes to adjust or change the phase of an oscillator signal by comparing the reference signal with an interpolated feedback signal and generate an oscillator control signal depending therefrom.

In an aspect, a phase locked loop, comprises a loop filter configured to provide a control signal to a controllable oscillator, said controllable oscillator configured to provide an oscillator signal in response to the control signal. A frequency divider is configured to provide a first feedback signal and a second feedback signal in response to the oscillator signal. The second feedback signal is delayed with respect to the first feedback signal. The phase locked loop comprises an interpolator configured to receive the first feedback signal, the second feedback signal and a phase control word. The interpolator is configured to provide an interpolated signal thereof between the first and second feedback signal and in response to the phase control word. Finally, the phase locked loop comprises a comparator path configured to receive the interpolated signal and to provide a signal to the loop filter in response to a phase deviation between a common reference signal and the interpolated signal.

With the present invention, the phase locked loop achieves a digitally programmable phase in the output signal using the interpolation circuit connected before the comparator path. The approach enables the utilization of a single phase detector and charge pump in the comparator path and still adjust a phase skew in the output signal of the phase locked loop with high linearity.

Accordingly, the interpolator may be configured to generate the feedback signal with a phase that is adjustable by the phase control word in the range between the first and second feedback signal. The delay between the first feedback signal and the second feedback signal corresponds to a certain phase skew. With the adjustable feedback signal generated by the interpolation circuit between the two signals, the phase locked loop is able to adjust phase of the output signal accordingly.

In an aspect, the interpolator is configured to generate the interpolated signal by time adjusting a logic level transition between logic level transitions of the first and the second feedback signal in response to the phase control word. For instance, the interpolator is configured to a logic high level transition between the transition to high levels of the feedback signal and the delayed feedback signal. An interpolator providing such interpolated signal can be implemented in various ways. In an aspect, the interpolator comprises a plurality of inverters arranged between an input and a common output node, each of the plurality of inverters selectively switchable in response to the phase control word. Such implementation may use well known space saving logic circuitry, which is relatively simple to implement and suitable for various frequency ranges.

In another aspect the interpolator comprises a first signal path at which the first feedback signal is applicable and a second signal path, at which the second feedback signal is applicable, outputs of each signal path connected to a common output node, wherein each signal path comprises at least one signal element that is selectively switchable to the common node in response to the phase control word.

It may be suitable to couple a level transition smoothing element to the common output node. Such element can be a capacitor for example. The element delays and makes gradual the level transition at the common output node and is selected in association with the intended range and resolution of the interpolator. In a further aspect, the first and the second signal path of the interpolator may each comprise a plurality of parallel arranged signal elements, each of the plurality of parallel arranged signal elements switchable into the respective signal path in response to the phase control word. In such implementation the sum of signal elements switched into the two signal paths may be constant. The more elements are switched into the first signal path, the faster the transition may then take place. In an embodiment, the signal element is an inverting element that is an element with an inverting behavior.

The interpolator may also comprise a dummy circuitry arranged such as to provide a substantially constant impedance load to at least one of the inputs of the interpolator irrespectively of the phase control word. The constant impedance may improve the linearity in the output signal phase upon adjustment. The interpolator may comprise a dummy structure arranged in parallel to an active structure of the interpolator. The dummy structure may generate a dummy signal. In an aspect, the dummy circuitry is coupled to the inputs of the interpolator.

The interpolator processes the feedback signal and the delayed feedback signal to provide an interpolated signal in between the feedback and the delayed feedback signal. A delay between the first feedback signal and the second feedback signal may substantially equal an integer multiple of half periods of the oscillator signal, and may in particular equal one period of the oscillator signal.

The proposed phase locked loop can be utilized in different arrangements. For instance, a phase locked loop arrangement for a beamforming system comprises at least two phase locked loops according to one of the preceding claims. The phase locked loop arrangement may further comprise a reference signal source providing the reference signal and coupled to the comparator path of each of the at least two phase locked loops. A phase deviation module may be configured to provide the phase control word to each of the phase locked loops to generate a phase difference between oscillator signals of the at least two phase locked loops.

A transmitter comprises in another aspect, a phase locked loop arrangement as discussed above and an antenna array having a plurality of antenna elements, wherein each of the antenna elements is in operative connection to a respective one of the phase locked loops of the phase locked loop arrangement to receive an individual signal for transmission derived from the respective oscillator signal thereof. A similar receiver arrangement comprises a phase locked loop arrangement and an antenna array having a plurality of antenna elements, wherein each of the antenna elements is in operative connection to a respective one of the phase locked loops of the phase locked loop arrangement to down-convert a received signal with the respective oscillator signal thereof.

Another aspect is related to a method for providing an oscillator signal in a phase locked loop, particular an oscillator signal with an adjustable phase. The method comprises to generate a reference signal and an oscillator signal in response to a control signal. A first feedback signal is generated based on the oscillator signal. Likewise a second feedback signal is generated based on the oscillator signal. The second feedback signal is delayed with respect to the first feedback signal. Then an interpolated signal is generated based on the first and second feedback signal and in response to a phase control word. Finally, the control signal is generated in response to a phase deviation between the interpolated signal and the reference signal.

In accordance with the proposed principle the phase control word enables an adjustment of the interpolated signal between the first and the second feedback signal. This adjustment of the interpolated signal, with a range corresponding to a time shift between the first and the second feedback signal, results in a corresponding time shift of the output signal, keeping the phase locked loop locked to the reference.

In an aspect the second feedback signal can be generated by delaying the first feedback signal depending on the frequency or period of the oscillator signal. Such delay can be for instance one period of the oscillator signal or more general any integer multiple of a half of the oscillator signal period. The interpolated signal can be generated to have a time shift between the first feedback signal and the second feedback signal. Alternatively, the interpolated signal can be generated by generating a signal with an adjustable phase in the range between the first feedback signal and the second feedback signal. In other words the interpolated signal may comprise a level transition between a level transition of the first feedback signal and a level transition of the same type by the second feedback signal.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

DETAILED DESCRIPTION

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

It should further be noted that any reference signs do not limit the scope of the claims, that the example embodiments may be implemented at least in part by means of both hardware and software, and that several "means", "units" or "devices" may be represented by the same item of hardware.

A "wireless device" as the term may be used herein, is to be broadly interpreted to include a radiotelephone having ability for Internet/intranet access, web browser, organizer, calendar, a camera (e.g., video and/or still image camera), a sound recorder (e.g., a microphone), and/or global positioning system (GPS) receiver; a personal communications system (PCS) user equipment that may combine a cellular radiotelephone with data processing; a personal digital assistant (PDA) that can include a radiotelephone or wireless communication system; a laptop; a camera (e.g., video and/or still image camera) having communication ability; and any other computation or communication device capable of transceiving, such as a personal computer, a home entertainment system, a television, etc. Furthermore, a device may be interpreted as any number of antennas or antenna elements.

Although the description is mainly given for a user equipment, as measuring or recording unit, it should be understood by the skilled in the art that "user equipment" is a non-limiting term which means any wireless device, terminal, or node capable of receiving in DL and transmitting in UL (e.g. PDA, laptop, mobile, sensor, fixed relay, mobile relay or even a radio base station, e.g. femto base station).

It is foreseeable that the next generation of cellular systems and wireless communication will use frequencies in the higher GHz frequency range, that is above 15 GHz and up to 60 GHz. Outdoors in rural and urban areas the signal echoes will have longer delays than indoors, so longer prefixes resulting in closer subcarrier-spacing in the proposed underlying OFDM modulation is required compared to indoor only systems. Consequently, phase noise and other requirements concerning the signal quality are increased to achieve a reliable data transmission enabling high data throughput. Furthermore, the signal attenuation at these frequencies will be high in a cellular system, which can be mitigated using beamforming systems. Such beamforming systems include a large number of antenna elements in an array, being able to transmit or receive in a desired and steerable direction. To control the beam or receiving direction, a dedicated phase shift of the signal must be applied to each respective antenna element. In a key implementation it has been proposed to establish such phase shift in the local oscillator signal provided by a PLL coupled to the respective antenna element.

In these cases, each antenna element is connected to a transceiver (transmitter and/or receiver, and each transceiver receives individual local oscillator (LO) signals from a local phase-controlled phase locked loop, or short PLL. The phase locked loop comprises a feedback path, normally including a programmable frequency divider circuit dividing the output oscillator signal by a programmable ratio and feeding the frequency-divided signal back to the phase comparator. As a result, the phase comparator using a common reference signal, e.g. a common reference signal in the low frequency range, the output signals of the PLLs will lock in different well defined phase relations. Regardless of scheme used for the frequency division, integer-N or fractional-N, there is a need to control the phase of the output signal of the different PLLs.

Some proposals suggested using digitally controlled current sources to inject current into the loop filters of each local PLL, which will produce a very accurately controlled and linear phase shift of the output signal.

A solution for generating the local oscillator signals with some control for its phase is for example illustrated in A. Axholt, H. Sjöland, "A PLL based 12 GHz LO generator with digital phase control in 90 nm CMOS", Analog Integrated Circuits and Signal Processing, Vol. 67, No. 3, pp. 309-318, 2011. Another example is shown in A. Axholt and H. Sjöland, "A 60 GHz Receiver Front-End with PLL based Phase Controlled LO Generation for Phased-Arrays", IEEE Proc. Asia Pacific Microwave Conference, APMC 2011, December 2011, Melbourne, Australia. In both cases, an additional adjustable current source injects a small DC current into the loop filters of each local PLL, which will produce a phase shift of the output signal. In equilibrium, the loop becomes frequency and phase locked and will strive to return in case of deviations.

In the examples shown in prior art, a phase-skew of one output cycle, that is 360° phase at the frequency of the output signal, between the reference signal and the feedback signal corresponds to a charge-pump charge pulse of $I_{CHP}^* (1/f_{osc})$. The current injected by the current source that corresponds to this charge pulse is transferred over (or "smeared out" over) the whole signal period of the reference signal $f_{REF}$. As a result, the ratio between the charge pulse current and the current injected by the current source becomes dependant from the divider ratio N within the feedback path of the phase locked loop:

$$I_{CHP}^*(1/f_{OSC})=I_{DC}^*(1/f_{REF})$$

$$I_{DC}=I_{CHP}^*(f_{REF}/f_{OSC})=I_{CHP}/N$$

For a 1-degree phase change, the required injected current becomes $$I_{DC}=I_{CHP}/(N^*360) \qquad (1)$$

As the output frequency of the oscillator signal is in the range of 20 GHz, while the reference frequency is about 300 MHz, one can assume under normal circumstances a divider ratio N between 50 and 100. If one assumes a divider ratio of N=70, the injected $I_{DC}$ current charge for a 1-degree phase skew becomes about 25000 times smaller than the charge pump current. As the accuracy of current ratios is typically limited by the matching properties, designs of current sources with good matching at such ratios are needed. It is difficult to realize current sources with this enormous ratio while maintaining good matching accuracy, for instance the technique of using unit current sources of equal design would require 25000 units for the charge pump current source. Hence, the solutions as stated above will call for a trade-off resulting in either phase control with low accuracy or large chip area. In other words, the current requirement on accuracy of the phase adjustment results in high requirements for current source matching leading to a substantial increase in chip size.

The present solution proposes a different concept, which may have the advantage in reducing the required transistor matching requirements to obtain certain phase accuracy. The proposed concept is based on the idea of generating a delayed version of the feedback signal in the frequency divider. The feedback signal and the delayed feedback signal from the divider are utilized as inputs to an interpolator circuit. The interpolator circuit generates an interpolated feedback signal for the phase comparator in the phase locked loop with a pre-determined time skew resulting in a similar time skew in a controlled oscillator output signal. The generation of said interpolated feedback signal can be achieved by interpolating between the original output signal from the frequency divider and the delayed output signal. The resulting interpolated feedback signal, also referred to as interpolated signal is—in other words—a time shifted version of the feedback signal from the frequency divider, wherein the time shift is adjustable between zero and a maximum time shift corresponding to the delay between the feedback signal of the divider and the delayed feedback signal. An interpolation circuit is capable of generating a feedback signal with a phase that is digitally programmable in the range between the feedback signal and the delayed feedback signal. This allows a single comparator path to receive the interpolated signal and generate a control signal therefrom.

Figure 1:
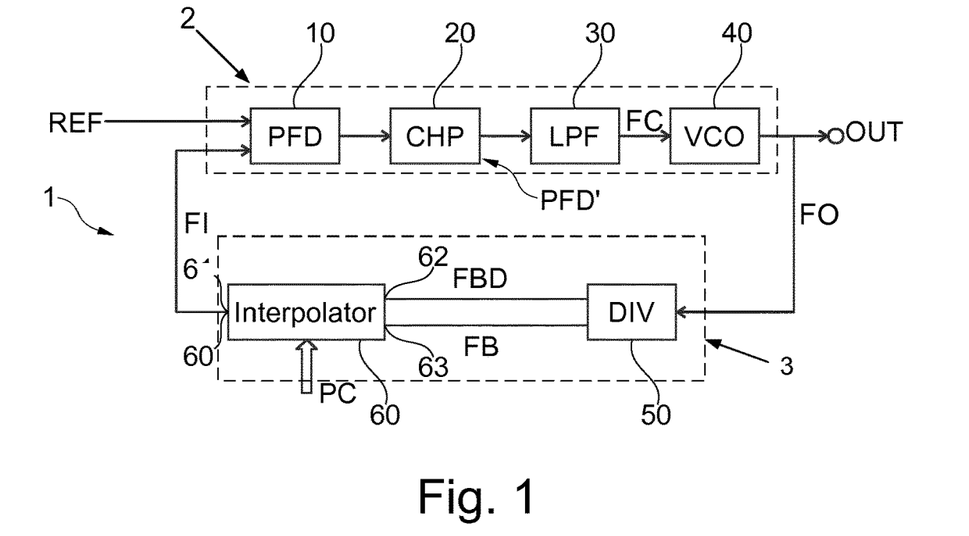
FIG. 1 illustrates an embodiment of a phase locked loop.

FIG. 1 illustrates an embodiment showing various aspects of the proposed principle. The phase locked loop 1 comprises a comparator or forward path 2 and a feedback path 3. The forward path comprises a phase comparator 10 with two inputs at which a reference signal REF and an interpolated signal FI (explained further below) is applied. Phase comparator 10 generates a phase deviation signal based on a phase comparison between the reference signal REF and the interpolated signal FI. The phase deviation signal is applied to a charge pump connected to the output of the phase comparator 10. Charge pump 20 provides current pulses corresponding to the phase deviation signal and supplies it via a low pass filter 30 to a voltage controlled oscillator 40 to adjust its phase and frequency.

An output of the controllable oscillator 40 providing the output signal of the phase locked loop is connected to the feedback path 3. The feedback path 3 comprises a frequency divider 50 dividing the output signal of the voltage controlled oscillator by an adjustable divider ratio in this example. While the divider ratio in this embodiment is fixed, the frequency divider may also comprise and adjustable divider ratio, i.e. in response to a frequency divider word. In addition to the frequency divided signal, corresponding to the first feedback signal FD, the frequency divider is configured to provide a delayed frequency divided signal FBD corresponding to a second feedback signal. The delayed frequency divided signal FBD comprises the same frequency as signal FD but is delayed to said signal by a specified delay, which is suitable set to a integer multiple of half a period of the oscillator signal OUT. In this example it is set to one period of the oscillator output signal. The first and second feedback signals are applied at respective inputs 63 and 62 of an adjustable interpolator circuit 60. Interpolator circuit 60 generates an interpolated signal FI at its output 61 for the phase comparator 10. The interpolated output signal corresponds to an adjustable delayed feedback signal, wherein the delay is adjustable by a phase control word PC between the first feedback signal and the second feedback signals. In other words, the interpolated output signal can be considered as corresponding to a time or phase shift of a pulse signal, wherein the shift is adjustable between the feedback signals at the inputs of the interpolator. The phase control word is a digital word. In an example, wherein the delay is one single oscillator period between the first feedback signal FB and the second delayed feedback signal FBD, the overall phase shift control range equals 360°. Depending on the resolution of the phase control word e.g. 8 bits, the shift can be adjusted in 256 steps resulting in an overall phase resolution of about 1.4°.

In summary, FIG. 1 illustrates a phase locked loop, comprising a loop filter configured to provide a control signal to a voltage controlled oscillator VCO, said voltage controlled oscillator configured to provide an oscillator signal in response to the control signal. A frequency divider is configured to provide a first feedback signal and a second feedback signal in response to the oscillator signal. The second feedback signal is delayed with respect to the first feedback signal. The phase locked loop comprises an interpolator configured to receive the first feedback signal, the second feedback signal and a phase control word. The interpolator is configured to provide an interpolated signal thereof between the first and second feedback signal and in response to the phase control word. Finally, the phase locked loop comprises a comparator path configured to receive the interpolated signal and to provide a respective signal to the loop filter in response to a phase deviation between a common reference signal and the interpolated signal.

Figure 2:
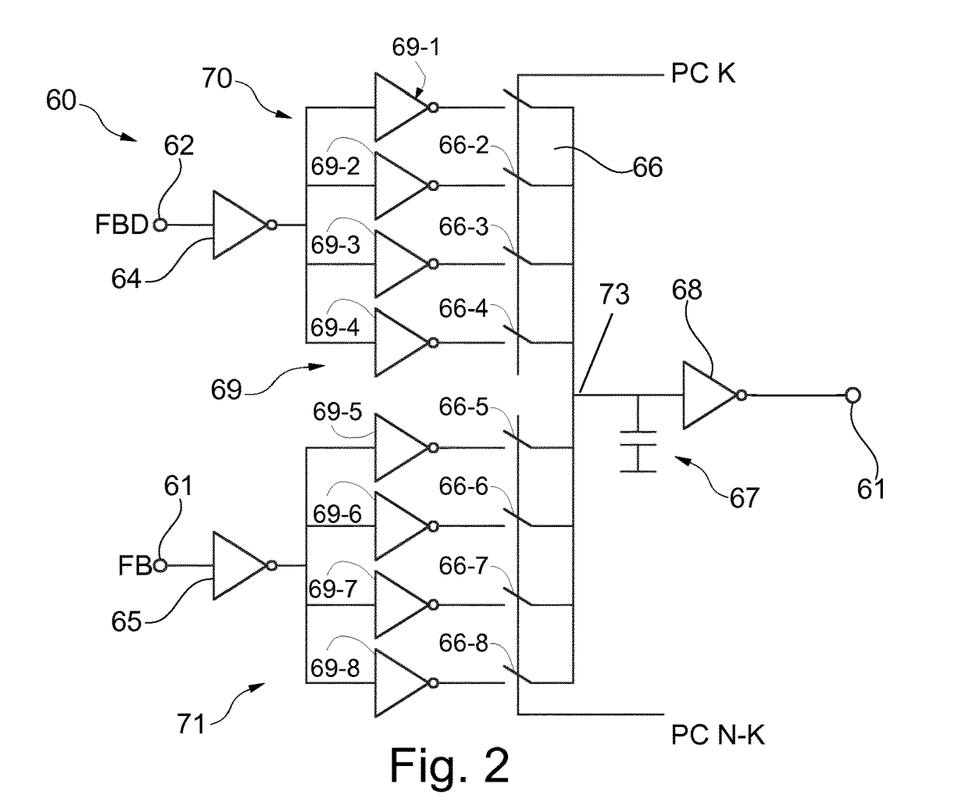
FIG. 2 shows an embodiment of an interpolator illustrating various aspects of the proposed principle.

FIG. 2 illustrates an example of an implementation of an interpolator circuit. In the example, the interpolator is configured to generate the interpolated signal with a phase that is adjustable by the phase control word in the range between the first and second feedback signals. For this purpose, the interpolator comprises an inverter bank 70 for processing the delayed feedback signal FBD at input terminal 62 and another inverter bank 71 for processing the feedback signal FB. Each path comprises an input inverter 64 and 65, respectively to mitigate any impact of an impedance change during processing the feedback signals. The output of the respective input inverter 64, 65 is then coupled to a series of parallel arranged inverter 69-1 to 69-8 of which four in each path are illustrated in FIG. 2. In the present embodiment, the physical parameters of the inverters 69-1 to 69-4 and 69-5 to 69-8 in each path are the same that is the inverter cells are unit cells, for instance having the same length and width and so on. In such case, each path has 5 different settings, resulting in 3 bits resolution. The unit size inverter cells provide good matching properties. In an alternative embodiment, the inverters of each path are binary weighted, corresponding to 16 different phase settings or 4 bits resolution.

Outputs of each inverter in each path are coupled via respective switches 66-1 to 66-8 to a common output node 73. The switches 66-1 to 66-4 in bank 70 are receiving a phase control word equal to K, while the switches 66-5 to 66-8 in bank 71 are receiving a phase control word equal to N−K, where N is the maximum phase control setting. In the example given, in which each inverter has the same dimension and physical parameters, N is the same as the number of inverters per bank, i.e. 4, but if binary weighted inverters are used, N equals $2^{\#\,bits}-1$, i.e. for 4 bits N=15. The number of bits is then equal to the number of inverters per bank.

The common output node 73 is connected to a capacitor 67 and to an output inverter 68. In operation capacitor 67 slows down node 73, so that the logic level transition of the output inverter 68 becomes a combination of the logic level transitions of banks 70 and bank 71. The capacitor 67 needs a certain charge to be charged to a voltage level where the logic transition occurs for the output inverter 68.

The transition in feedback signal FB occurs earlier than in the delayed feedback signal FBD. Hence, the current from the inverters in path 71 comes earlier than from the inverters in path 70. So, the more inverters 69-5 to 69-8 from bank 71 that are switched into path, the earlier transition and vice versa. In the extreme case when only inverters from bank 70 are switched to node 73, the transition is completely determined by the delayed feedback signal FBD, representing the transition with most delay; and the other extreme with only inverters from bank 71 connected to node 73, representing the transition with smallest delay. However, even if only inverters 69-5 to 69-8 in bank 71 are connected to node 73, i.e. the total current is coming at time T1, it will still take some time to charge capacitor 67. As a consequence, there is a small delay from the transition in the parallel inverters 69-5 to 69-8 to the transition in the output inverter 68. This delay represents the minimum delay of the interpolator. Then when more inverters from bank 70 are switched in and inverters from bank 71 are switched out the delay is increased because more of the total current is coming later.

In aspects of the present disclosure, the interpolator is therefore configured to generate the interpolated signal by adjusting a logic level transition between logic level transitions of the first and the second feedback signal in response to the phase control word. In summary, the interpolator comprises a first signal path at which the first feedback signal is applicable and a second signal path, at which the second feedback signal is applicable, outputs of each signal path connected to a common output node, wherein each signal path comprises at least one signal inverting element that is selectively switchable to the common output node in response to the phase control word.

Figure 8:
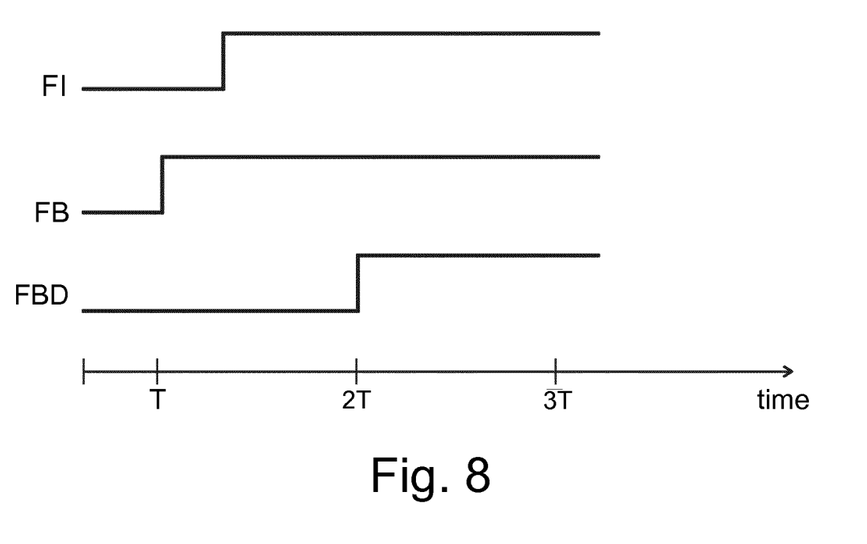
FIG. 8 shows a time diagram for several exemplary signals illustrated in the embodiment of FIG. 1.

FIG. 8 shows in this regard a time signal diagram illustrating the general principle of an interpolator according to the proposed principle. The delay between the first feedback signal FB and the second feedback signal FBD is set to one period T of the oscillator signal. Such total delay of one period corresponds to a potential maximum phase shift of 360°. The interpolated signal FI is now adjustably set between a minimum delay corresponding to the level transition from low to high of the first feedback signal FB and a maximum delay corresponding to the delayed second feedback signal FBD. When comparing the signal flow of FIG. 8 with the embodiment of FIG. 2, one realizes that at time T1 the first feedback signal FB changes from low level to high level resulting in low level at the output of input inverter 65 and high level at each of the inverters in inverter bank 71. Likewise the low level of signal FBD at time T1 results in low output signal of the inverters of bank 70. Prior to time T1, when both feedback signals are at low level the output signal FI is also low, as all inverters in inverter banks 70 and 71 are at low level irrespectively of the switches and consequently the capacitor is discharged. The two output inverters 68 provide a low level for interpolated signal FI.

In the present example of FIG. 8 the interpolated signal FI is supposed to switch a half oscillator period after minimum interpolator delay from low to high level. In other words, the delay between the first feedback signal and the second feedback signal substantially equals an integer multiple of the half periods of the oscillator signal, in particular one period of the oscillator signal.

For this purpose and under the assumption, all inverters in the bank are of the same dimension, N–K switches of the switches 66-5 to 66-8 of the lower chain, corresponding to the phase control word K, are closed. K of the switches in the upper bank 70 corresponding to the phase control word K, are closed. If we for this example assume the number of unit inverter cells N to be equal to 4, we choose the phase control word K to be equal to 2 to obtain half oscillator period delay of the interpolated signal which corresponds to a 180° phase shift of the oscillator output signal compared to the minimum interpolator delay. At time T1 the feedback signal FB switches from low to high, resulting in a transition to high level for all inverters of inverter bank 71. Hence, a current is provided by N–K of the inverters in inverter bank 71 to capacitor 67, corresponding to the phase control word equal to K. Signal FBD is still at low level resulting in a low level at the output for all inverters in bank 70. At time T2 the second feedback signal also switches to high level, resulting in an additional current being provided by K inverters in bank 70 to capacitor 67, corresponding to phase control word K. Now the capacitor is charged with the total available current corresponding to N inverters. The voltage level across capacitor 67 increases as a function of the charging current. When the voltage over capacitor 67 reaches the threshold level of output inverter 68, the interpolated output signal switches from high to low level. The exact transition time is a function of the capacitor and the charging current provided by the inverters and can be predesigned in a very precise way. In the given example the voltage across the capacitor first increases as a function of half the total available current, corresponding to N–K=2 inverters, and then at time T2, as function of the total available current, corresponding to N=4 inverters.

With careful design of the capacitor, the inverter banks and the threshold level of the output inverter 68, the transition time of inverter 68 will be halfway between the transition times compared to the extreme cases which are with only the feedback signal FB or the delayed feedback signal FBD switched in. Depending on the setting for the phase control word, the transition for the interpolated signal can be adjusted in steps defining the overall phase skew resolution between the feedback and the delayed feedback signal.

Figure 3:
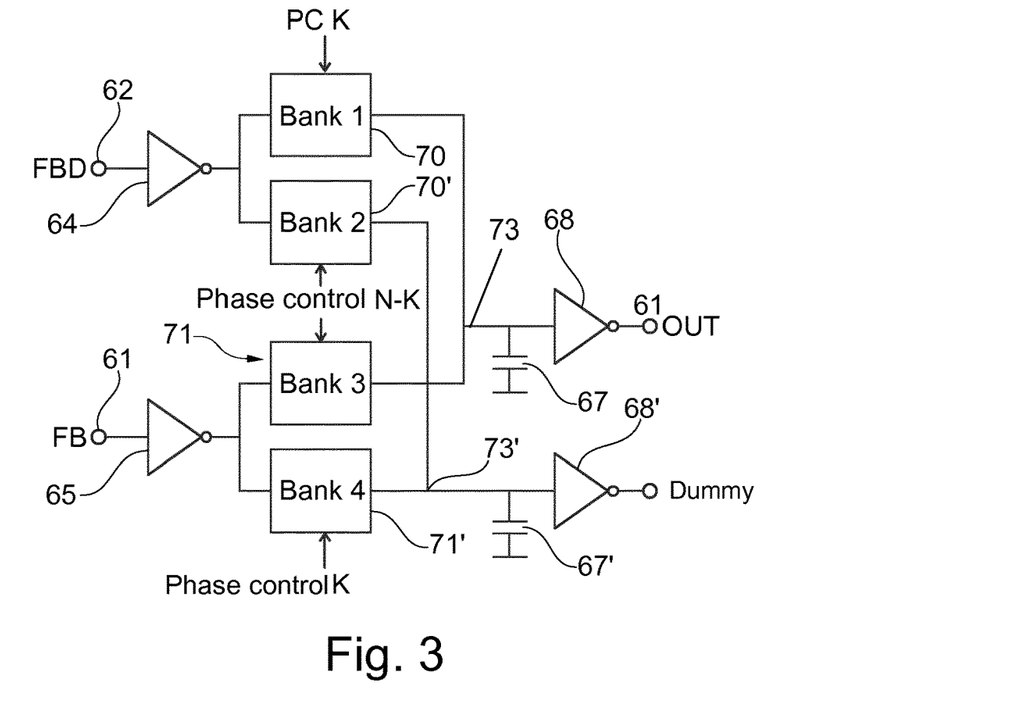
FIG. 3 shows another embodiment of an interpolator illustrating some aspects of the proposed principle.

In the implementation of FIG. 2, the driving stages, i.e. the input inverters 64 and 65 have finite output impedance. The switched inverters 69-1 to 69-8 of each bank 70 and 701, respectively, comprise a certain load as well resulting in different impedance depending on their respective switching status. For instance many inverters switched into the respective banks may have overall different load impedance compared to a single inverter switched into the overall path. The different impedances will affect the timing of the overall interpolator and in particular the driving stages. As a consequence, changes in the load impedance may result in a non-linear behavior of the phase skew function, i.e. phase skew vs phase control word. FIG. 3 illustrates an embodiment mitigating such effect and showing various aspects of the proposed principle. The interpolator comprises an additional dummy structure, which is basically a copy of the real structure. The dummy circuitry is arranged such as to provide a substantially constant impedance load to at least one of the input driving stages of the interpolator irrespectively of the phase control word.

In the embodiment in FIG. 3, the signal provided by the respective input inverters 64 and 65 in the respective chains are split up and provided to dummy banks 70' and 71'. The dummy banks comprise the same inverter structure as banks 70 and 71. They are coupled to respective switches, which are controlled by the phase control word and also connected to a common output node 73', capacitor 67' and output inverter structure 68'. The main difference to the real structure generating the interpolated signal FI used by the forward path is that the output signal of output inverter 68' of the dummy structure is not used by the PLL. In other words, the dummy circuitry or structure is also coupled to the inputs of the interpolator, thereby generating a dummy signal, and arranged in parallel to an active structure of the interpolator, said active structure generating the interpolated signal.

By including the dummy structure as a copy of the real structure, the two overall structures and particular the input and output inverters will be loaded by a fixed number of switched in and switched out inverters independent of the phase setting. When processing the feedback signal FB, the input driver stage will be loaded by banks 71 and 71', with K switched in inverters in dummy inverter bank 71' and N–K switched in inverters in bank 71. The total number of switched in inverters thus becomes equal to N, regardless of phase setting K. In the same way the number of switched out inverters becomes constant and equal to N. For the driver of the delayed feedback signal FBD, it will be loaded by banks 70 and 70', with N–K switched in inverters in bank 70' and K in inverter bank 70. The total number of switched in inverters thus becomes equal to N, regardless of phase setting. With a total of 2N inverters in bank 71 and 71', the number of switched out inverters becomes equal to N.

The proposed interpolator can be based on simple CMOS inverters and be used to provide a phase locked loop having programmable phase with high accuracy. Such a phase locked loop is attractive in beamforming 5G equipment. The forward path of the phase locked loop is not affected and can be designed with existing techniques.

Figure 4:
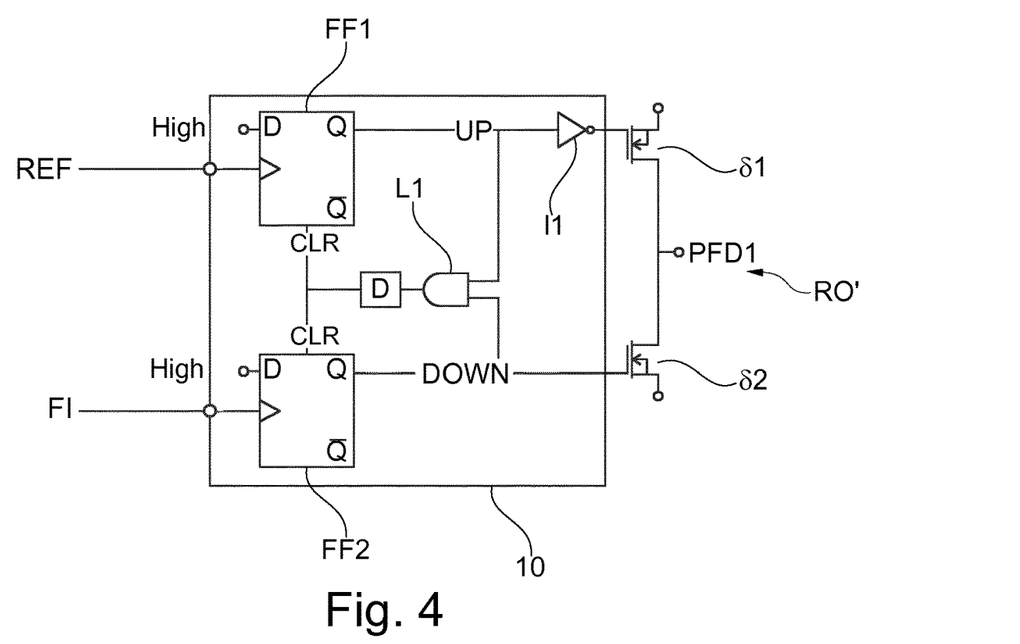
FIG. 4 shows an illustration of a phase detector suitable for an embodiment of the phase locked loop.

For instance, FIG. 4 illustrates an exemplary embodiment of a phase comparator 10. Phase comparator 10 comprises two positive-edge triggered D-Flip-flops FF1 and FF2, wherein their respective signal inputs D are put to HIGH-state. At the clock inputs of each D-Flip-Flop, the reference signal REF and the interpolated feedback signal FI, respectively are applied. Data output Q of flip-flop FF1 is connected to inverter I1 and to an input of a logic AND-gate L1. Output of inverter I1 is connected to a gate of a switch δ1 of the charge pump arrangement 20'. Output Q of flip-flop FF2 is connected to the other input of the logic AND-gate L1 and to gate of switch δ2 of the charge pump arrangement. Both switches δ1 and δ2 are coupled to a common output. Output of logic Gate L1 is coupled via delay element D to the reset inputs CLR of the two flip-flops. When both outputs Q are high, gate L1 will disable the FF1 and FF2 after some delay, causing a reset pulse. Without delay element D, the disablement of flip-flops FF1 and FF2 may cause the outputs Q to a high impedance state, stopping the phase comparator from working by producing neither positive nor negative current pulses. In case of phase or frequency deviation between the reference signals and the feedback signal, one of the flip-flops FF1, FF2 produce a respective longer control signal up or down.

The phase locked loop in accordance with several aspects can form a part of a phase locked loop arrangement having more than one phase locked loop. 11. A phase locked loop arrangement for a beamforming system can have at least two phase locked loops as disclosed above and further comprise a reference signal source and a phase deviation module. The reference signal source provides the reference signal and coupled to the comparator path of each of the at least two phase locked loops. The phase deviation module can be configured to provide the phase control word to each of the phase locked loops to generate a phase difference between oscillator signals of the at least two phase locked loops.

Figure 5:
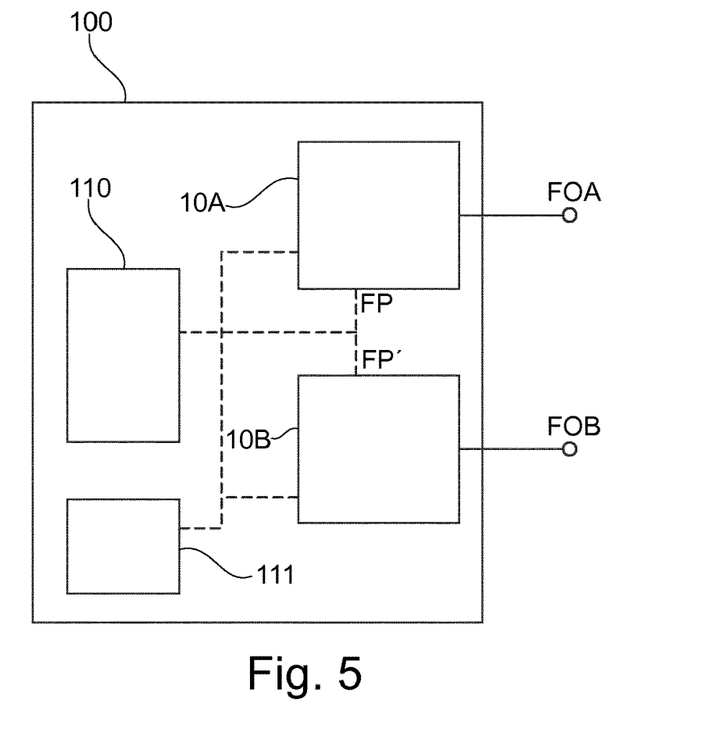
FIG. 5 illustrates a part of a transceiver system in accordance with some aspects of the disclosure.

FIG. 5 shows some aspects of such a phase locked loop arrangement 100 suitable for a beamforming system. The arrangement comprises at least two phase locked loops 10A, 10B in accordance with the proposed principle (two of which are shown here). The arrangement further comprises a reference signal source 111 providing the reference signal FR. The reference signal source, for example including a temperature stable frequency reference is coupled to the first and second comparator path of each of the phase locked loops 10A and 10B. Further, a phase deviation module 110 is configured to provide a phase control signal FP, FP' to each of the phase locked loops 10A, 10B to generate a phase difference between oscillator signals FOA and FOB of the at least two phase locked loops. The phase control signal FP, FP' can be a digital control word or an analogue signal. The phase control signals FP, FP' are used in the adjustment circuits of the phase locked loops 10A and 10B to generate adjustment signals.

An application of the phase locked loop arrangement can be in a transceiver device. The term transceiver shall include not only a device able to transmit and receive signals, but also contain a pure transmitter or pure receiver. A transmitter in this regard may comprise a phase locked loop arrangement as stated above and an antenna array having a plurality of antenna elements, wherein each of the antenna elements is in operative connection to a respective one of the phase locked loops of the phase locked loop arrangement to receive an individual signal for transmission derived from the respective oscillator signal thereof. Likewise a receiver arrangement according to one or more aspects may comprise a phase locked loop arrangement as disclosed before and an antenna array having a plurality of antenna elements, wherein each of the antenna elements is in operative connection to a respective one of the phase locked loops of the phase locked loop arrangement to down-convert a received signal with the respective oscillator signal thereof.

Figure 6:
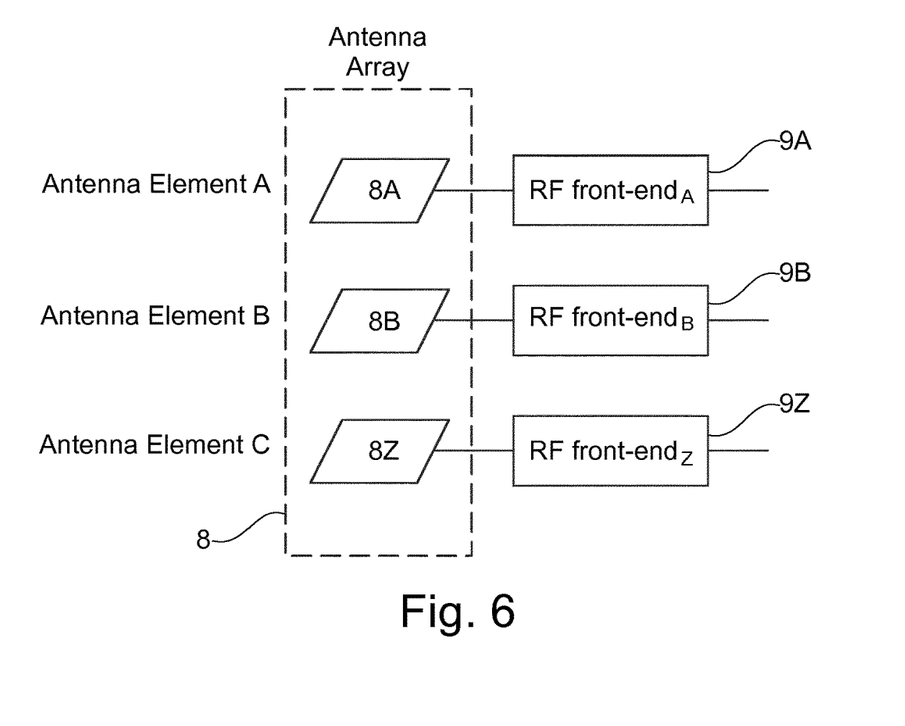
FIG. 6 shows an example of a transceiver element including transmitter and receiver in accordance with some aspect of the present disclosure.

An exemplary transceiver is illustrated in FIG. 6. The transceiver herein is implemented as a beamforming system and comprises an antenna array 8 with a plurality of antenna elements 8A to 8Z. Each of the antenna elements may be located at a different position in space and also point to a different direction. The antenna array may extend over a large area and several elements 8A to 8Z are separated in space from each other. For example an antenna array may cover an area from a few square centimeters up to several square meters and comprise up to hundreds of individual antenna elements located in that area. In one aspect, the antenna elements are in a fixed position with respect to each other. Each antenna element 8A to 8Z of the antenna array 8 is coupled to a respective RF front-end 9A to 9Z. The RF front-ends are configured to transmit signals to the respective elements, and also receive signals from them. In case of a pure transmitter, the RF front-ends are configured only to transmit signals to the respective antenna elements. For a pure receiver, the RF front-ends are configured to receive signals therefrom.

In accordance with aspects of the present disclosure, signals transmitted from the RF front-ends comprise, despite being modulated, different dedicated phase skews. These phase skews result in control of the direction of the beam being transmitted over the antenna array 8. This can be used to increase the signal strength in a receiver for demodulation. Likewise, any signal received via the antenna elements A, B and C is processed in the respective RF front-ends 9A to 9Z using phase shifted LO signals. Signals from a specific direction are constructively amplified or combined, while signals from a different direction not corresponding to the respective phase shifted signal are suppressed.

Figure 7:
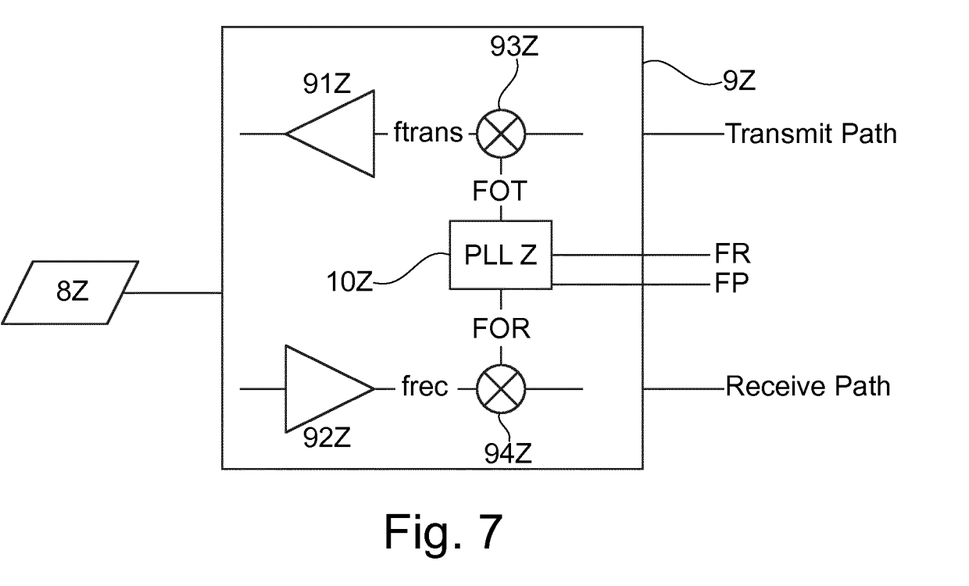
FIG. 7 illustrates aspects of the method for providing an oscillator signal in a phase locked loop.

An implementation of a device for adjusting the phase further illustrated in FIG. 7 showing an exemplary embodiment of an individual RF front-end 9Z. Each of the RF front-ends is divided into a transmitter path for a transmission signal ftrans and a reception path for processing a received signal frec. Each path comprises an up-mixing module 93Z and a down-mixing module 94Z, respectively. The mixing modules are using a local oscillator signal FOT and FOR provided by a phase locked loop module 10Z. Signal FOT is the LO signal used for transmission, with an adjusted phase due to interpolation. Likewise FOR corresponds to an LO signal with an adjusted phase due to interpolation. Phase locked loop module 10Z can include one or more phase locked loops to generate a local oscillator signal FOT and FOR, respectively. Phase locked loop module 10Z comprises an input for the reference signal FR and for the phase control signal FP.

In the transmission path, mixing module 93Z is used to frequency up-convert or to modulate the data to be transmitted to the transmission signal ftrans. In this regard, the mixing module 93Z can comprise a conventional mixer, a modulator of some sort, i.e. a quadrature modulator, any combination thereof or any other device using the oscillator signal FOT to generate the transmission signal ftrans therefrom. The transmission signal is then amplified using amplifier module 91Z and fed to antenna element 8Z connected thereto. Likewise a received signal frec is amplified using a low-noise amplification module 92Z and then converted to a lower frequency using the oscillator signal FOR. The phase locked loop module 10Z providing the oscillator signals is part of the phase locked loop arrangement as discussed previously. Accordingly, it comprises a frequency and phase adjustment input to adjust the frequency and phase of the oscillator signals FOT and FOR. The phase locked loop module 10Z may in some cases, like in a frequency division duplex (FDD) system, consist of two separate PLLs generating different frequencies for FOT and FOR.

Other aspects are related to a method for generating an output signal. The method comprises generating a reference signal and an oscillator signal in response to a control signal. First and second feedback signals are generated based on the oscillator signal, wherein the second feedback signal is delayed with respect to the first feedback signal. An interpolated signal based on the first and second feedback signal is generated in response to a phase control word and finally, the control signal is generated (FC) in response to a phase deviation between the interpolated signal ( ) and the reference signal (FR).

Figure 9:
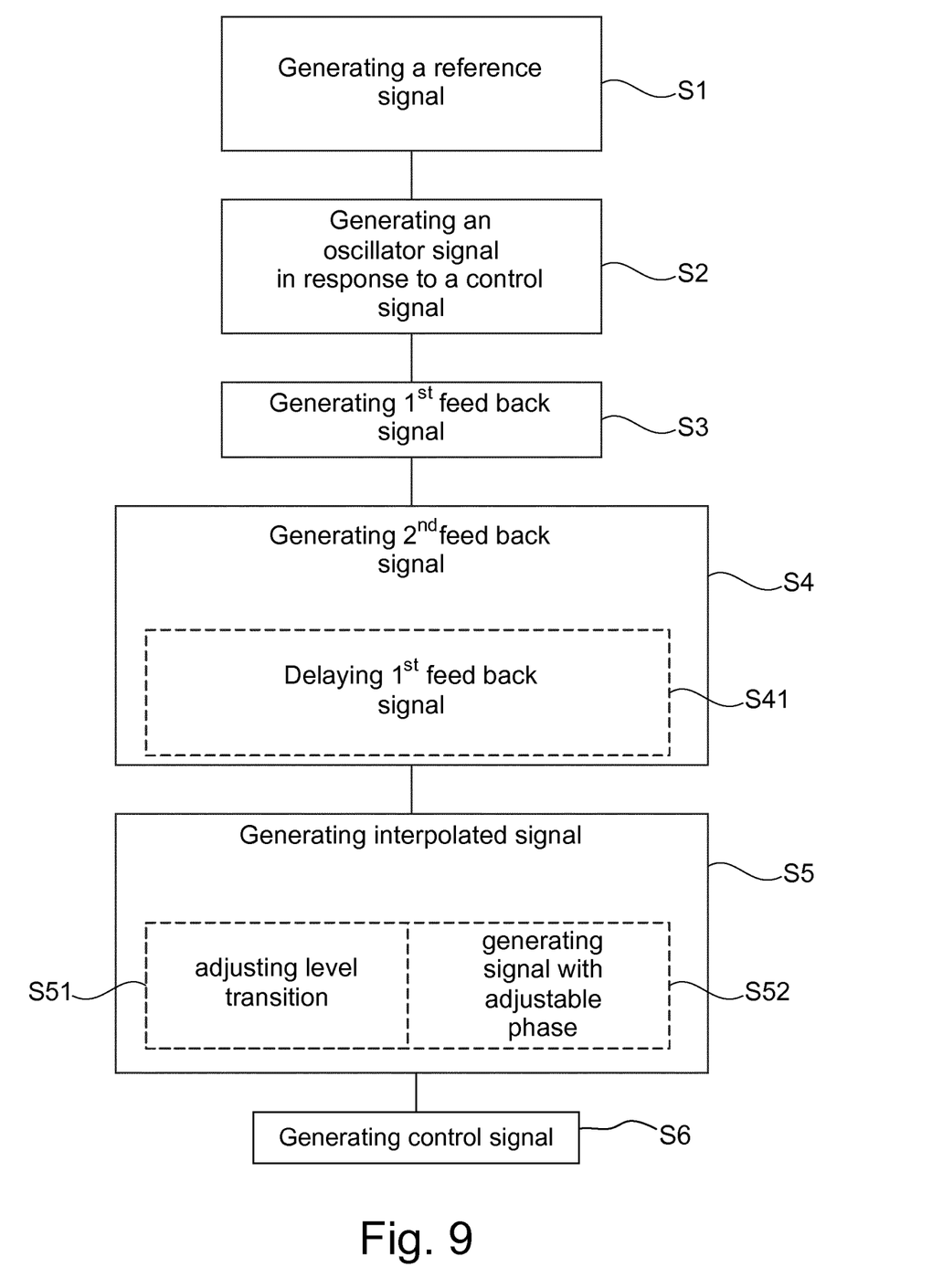
FIG. 9 shows an illustration of a method for providing an oscillator signal.

FIG. 9 illustrates an exemplary embodiment disclosing one or more aspects of the above. In step S1 a reference signal is generated, for example from a reference signal source with a very stable oscillator. Typical reference signals have a frequency of several 10 MHz, i.e. 26 MHz or 52 MHz and for some systems up to 5 Ghz. Furthermore, as part of the operation of a phase locked loop an oscillator output signal is provided and generated in response to a control signal in step S2. Said control signal may correspond to the control signal provided by the charge pump or the loop filter in the forward path of the oscillator. The output signal may be feedback and a $1^{st}$ feedback signal is generated from the output signal. For example, the first feedback signal is frequency divided by an adjustable ratio as to provide the first feedback signal. The $2^{nd}$ feedback signal is also generated—in this case together—with the $1^{st}$ feedback signal based on the oscillator signal in step S4.

The $2^{nd}$ feedback signal has the same frequency as the $1^{st}$ feedback signal but is delayed with respect to the $1^{st}$ feedback signal by a specific time. In an aspect illustrated in optional step S41, the $2^{nd}$ feedback signal can be generated from the first feedback signal by simply delaying the first feedback signal a predetermined time. This will result in a "copy" of the $1^{st}$ feedback signal, which is then delayed by a pre-determined time. Alternatively, it is generated in parallel to the $1^{st}$ feedback signal.

The delay between the $1^{st}$ feedback signal and the $2^{nd}$ feedback signal can be adjustable. For instance the delay can be set to an integer multiple of half periods of the oscillator output signal. It can be for instance one period of the oscillator output signal corresponding to a 360° phase shift thereof.

In step S5, the interpolated signal is generated based on the $1^{st}$ and $2^{nd}$ feedback signals and in response to a phase control word. The phase control word adjusts a transition of the interpolated signal to follow at a specific time after or prior to the $1^{st}$ and $2^{nd}$ feedback signals. The interpolated signal corresponds to a signal with an adjustable phase in the range between the $1^{st}$ and $2^{nd}$ feedback signals. The adjustment is in response to the phase control word. In other words the phase control word may time adjust a level transition. The resolution of the phase control word and the overall delay between the $1^{st}$ and $2^{nd}$ feedback signals will define the resolution and the maximum range of the introduced phase skew. For instance, with a delay corresponding to a single period of the oscillator signal and a phase control word of 8 bits, the resolution of the phase skew can be 360°/256=appr 1.4°. If binary weighted inverter cells are assumed. Depending on the implementation different amounts of inverter cells in the respective banks are needed. In case of inverter cells having the same dimension, i.e. so called unit cells, the above stated resolution requires 255 inverter unit cells per bank. With binary weighted cells, 8 binary weighted inverter cells per bank are required.

After generating the interpolated signal, the control signal will be generated in step S6 in response to a phase deviation between the generated interpolated signal and the reference signal. Due to the feedback nature of the phase locked loop, the loop is forced to react on the changed phase relationship between the reference signal and the interpolated feedback signal. The loop compensates this by changing phase of the oscillator. The change of phase of the oscillator signal will in turn change the phase of the feedback signal so that the reference and the interpolated feedback signal FI remain in phase.

The present disclosure proposes a phase locked loop using adjustable interpolation between a first and a second frequency divided feedback signals to obtain an interpolated signal fed into the forward path of the phase locked loop. This interpolation introduces a phase skew in the oscillator's output signal. As the forward path is maintained and designed with existing techniques, the characteristics of the phase locked loop, i.e. the behavior of bandwidth, settling etc. remains substantially constant. In cases, in which an additional dummy structure is used in the interpolator, a further linearization between the applied phase control word and the introduced phase skew in the oscillator's output signal is achieved.

The proposed structure can be implemented using relatively simple inverters based on CMOS technology. The Phase locked loop comprises programmable phase with high accuracy. Such phase locked loops are attractive in beamforming 5G equipment.

The invention claimed is:

1. A phase locked loop arrangement for a beamforming system having at least two phase locked loops, each phase locked loop comprising:
    a loop filter configured to provide a control signal to a controllable oscillator, the controllable oscillator configured to provide an oscillator signal in response to the control signal;
    a frequency divider configured to provide a first feedback signal and a second feedback signal in response to the oscillator signal, the second feedback signal delayed with respect to the first feedback signal;
    an interpolator configured to:
        receive the first feedback signal, the second feedback signal, and a phase control word; and
        provide an interpolated signal thereof between the first and second feedback signal and in response to the phase control word; and
        wherein the interpolator comprises a dummy circuitry arranged such as to provide a substantially constant impedance load to at least one of the inputs of the interpolator irrespectively of the phase control word;
    a comparator path configured to receive the interpolated signal and to provide a respective signal to the loop filter in response to a phase deviation between a common reference signal and the interpolated signal;
    a reference signal source providing a reference signal and coupled to the comparator path of each of the at least two phase locked loops;

a phase deviation circuit configured to provide the phase control word to each of the phase locked loops to generate a phase difference between oscillator signals of the at least two phase locked loops.

2. The phase locked loop arrangement of claim 1, wherein the interpolator is configured to generate the feedback signal with a phase that is adjustable by the phase control word in the range between the first and second feedback signals.

3. The phase locked loop arrangement of claim 1, wherein the interpolator is configured to generate the interpolated signal by adjusting a logic level transition between logic level transitions of the first and the second feedback signals in response to the phase control word.

4. The phase locked loop arrangement of claim 1, wherein the interpolator comprises a plurality of inverters arranged between an input and a common output node, each of the plurality of inverters selectively switchable in response to the phase control word.

5. The phase locked loop arrangement of claim 1:
wherein the interpolator comprises a first signal path at which the first feedback signal is applicable, and a second signal path at which the second feedback signal is applicable, outputs of each signal path connected to a common output node;
wherein each signal path comprises at least one signal inverting element that is selectively switchable to the common node in response to the phase control word.

6. The phase locked loop arrangement of claim 5, wherein the common output node is coupled to a capacitor.

7. The phase locked loop arrangement of claim 5, wherein the first and the second signal paths each comprise a plurality of parallel arranged inverting elements, each of the plurality of parallel arranged inverting element switchable into the respective signal path in response to the phase control word.

8. The phase locked loop arrangement of claim 1, wherein the dummy circuitry is:
coupled to the inputs of the interpolator;
configured to generate a dummy signal; and
arranged in parallel to an active structure of the interpolator, the active structure generating the interpolated signal.

9. The phase locked loop arrangement of claim 1, wherein a delay between the first feedback signal and the second feedback signal substantially equals an integer multiple of half periods of the oscillator signal.

10. A transmitter arrangement, comprising:
at least two phase locked loops, wherein each of the phase locked loops comprises:
a loop filter configured to provide a control signal to a controllable oscillator, the controllable oscillator configured to provide an oscillator signal in response to the control signal;
a frequency divider configured to provide a first feedback signal and a second feedback signal in response to the oscillator signal, the second feedback signal delayed with respect to the first feedback signal;
an interpolator configured to:
receive the first feedback signal, the second feedback signal, and a phase control word; and
provide an interpolated signal thereof between the first and second feedback signal and in response to the phase control word; and
wherein the interpolator comprises a dummy circuitry arranged such as to provide a substantially constant impedance load to at least one of the inputs of the interpolator irrespectively of the phase control word;
a comparator path configured to receive the interpolated signal and to provide a respective signal to the loop filter in response to a phase deviation between a common reference signal and the interpolated signal;
a reference signal source providing a reference signal and coupled to the comparator path of each of the at least two phase locked loops;
a phase deviation circuit configured to provide the phase control word to each of the phase locked loops to generate a phase difference between oscillator signals of the at least two phase locked loops; and
an antenna array having a plurality of antenna elements, wherein each of the antenna elements is in operative connection to a respective one of the phase locked loops of the phase locked loop arrangement to receive an individual signal for transmission derived from a respective oscillator signal thereof.

11. A receiver arrangement, comprising:
at least two phase locked loops, wherein each of the phase locked loops comprises:
a loop filter configured to provide a control signal to a controllable oscillator, the controllable oscillator configured to provide an oscillator signal in response to the control signal;
a frequency divider configured to provide a first feedback signal and a second feedback signal in response to the oscillator signal, the second feedback signal delayed with respect to the first feedback signal;
an interpolator configured to:
receive the first feedback signal, the second feedback signal, and a phase control word; and
provide an interpolated signal thereof between the first and second feedback signal and in response to the phase control word; and
wherein the interpolator comprises a dummy circuitry arranged such as to provide a substantially constant impedance load to at least one of the inputs of the interpolator irrespectively of the phase control word;
a comparator path configured to receive the interpolated signal and to provide a respective signal to the loop filter in response to a phase deviation between a common reference signal and the interpolated signal;
a reference signal source providing a reference signal and coupled to the comparator path of each of the at least two phase locked loops;
a phase deviation circuit configured to provide the phase control word to each of the phase locked loops to generate a phase difference between oscillator signals of the at least two phase locked loops; and
an antenna array having a plurality of antenna elements, wherein each of the antenna elements is in operative connection to a respective one of the phase locked loops of the phase locked loop arrangement to down-convert a received signal with the respective oscillator signal thereof.

* * * * *